US 8,479,683 B2

(12) United States Patent
Antonelli et al.

(10) Patent No.: US 8,479,683 B2
(45) Date of Patent: Jul. 9, 2013

(54) APPARATUS INCLUDING A PLASMA CHAMBER AND CONTROLLER INCLUDING INSTRUCTIONS FOR FORMING A BORON NITRIDE LAYER

(75) Inventors: George Andrew Antonelli, Portland, OR (US); Mandyam Sriram, Beaverton, OR (US); Vishwanathan Rangarajan, Beaverton, OR (US); Pramod Subramonium, Beaverton, OR (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 13/615,318

(22) Filed: Sep. 13, 2012

(65) Prior Publication Data

US 2013/0008378 A1    Jan. 10, 2013

Related U.S. Application Data

(62) Division of application No. 12/750,180, filed on Mar. 30, 2010, now Pat. No. 8,288,292.

(51) Int. Cl.
*B05C 11/00* (2006.01)

(52) U.S. Cl.
USPC ............ 118/697; 118/695; 118/506; 118/698

(58) Field of Classification Search
USPC .......... 257/288, 369, 632, E21.249; 438/197, 438/199, 226, 535, 653
See application file for complete search history.

(56) References Cited

U.S. PATENT DOCUMENTS

| | | | |
|---|---|---|---|
| 5,470,661 A | 11/1995 | Bailey et al. | |
| 5,877,095 A | 3/1999 | Tamura et al. | |
| 5,965,216 A | 10/1999 | Neuberger et al. | |
| 5,976,990 A | 11/1999 | Mercaldi et al. | |
| 7,214,630 B1 | 5/2007 | Varadarajan et al. | |
| 7,247,582 B2 | 7/2007 | Stern et al. | |
| 7,327,001 B1 | 2/2008 | Singhal et al. | |
| 7,371,634 B2 | 5/2008 | Chiang et al. | |
| 7,381,451 B1 | 6/2008 | Lang et al. | |
| 7,396,718 B2 | 7/2008 | Frohberg et al. | |
| 7,482,245 B1 | 1/2009 | Yu et al. | |

(Continued)

FOREIGN PATENT DOCUMENTS

WO    2007/043206    4/2007

OTHER PUBLICATIONS

U.S. Appl. No. 12/134,961, filed Jun. 6, 2008, entitled "Method for making high stress boron-doped carbon films," Wu et al.

(Continued)

*Primary Examiner* — Evan Pert
*Assistant Examiner* — Mark A Laurenzi
(74) *Attorney, Agent, or Firm* — Weaver Austin Villeneuve & Sampson LLP (57) ABSTRACT

A method of forming a boron nitride or boron carbon nitride dielectric produces a conformal layer without loading effect. The dielectric layer is formed by chemical vapor deposition (CVD) of a boron-containing film on a substrate, at least a portion of the deposition being conducted without plasma, and then exposing the deposited boron-containing film to a plasma. The CVD component dominates the deposition process, producing a conformal film without loading effect. The dielectric is ashable, and can be removed with a hydrogen plasma without impacting surrounding materials. The dielectric has a much lower wet etch rate compared to other front end spacer or hard mask materials such as silicon oxide or silicon nitride, and has a relatively low dielectric constant, much lower then silicon nitride.

1 Claim, 6 Drawing Sheets

U.S. PATENT DOCUMENTS

| | | | |
|---|---|---|---|
| 7,566,655 | B2 | 7/2009 | Balseanu et al. |
| 7,906,817 | B1 | 3/2011 | Wu et al. |
| 7,935,587 | B2 | 5/2011 | Chen et al. |
| 7,998,881 | B1 | 8/2011 | Wu et al. |
| 2002/0076918 | A1 | 6/2002 | Han et al. |
| 2006/0024879 | A1 | 2/2006 | Fu et al. |
| 2006/0185591 | A1 | 8/2006 | Muralidharan et al. |
| 2007/0032024 | A1 | 2/2007 | Peidous et al. |
| 2007/0105292 | A1 | 5/2007 | Chen et al. |
| 2007/0132054 | A1 | 6/2007 | Arghavani et al. |
| 2007/0200179 | A1 | 8/2007 | Chen |
| 2007/0287240 | A1 | 12/2007 | Chen et al. |
| 2008/0020591 | A1 | 1/2008 | Balseanu et al. |
| 2008/0292798 | A1 | 11/2008 | Huh et al. |
| 2009/0017640 | A1 | 1/2009 | Huh et al. |
| 2009/0039475 | A1 | 2/2009 | Shioya |
| 2009/0250762 | A1 | 10/2009 | Liu et al. |
| 2009/0263972 | A1 | 10/2009 | Balseanu et al. |

OTHER PUBLICATIONS

U.S. Appl. No. 13/016,660, filed Jan. 28, 2011, entitled "High compressive stress carbon liners for MOS devices," Wu et al.

U.S. Appl. No. 13/177,450, filed Jul. 6, 2011, entitled "Method for making high stress boron-doped carbon film," Wu et al.

U.S. Appl. No. 10/972,084, filed Oct. 22, 2004, entitled "Tensile dielectric films using UV curing."

U.S. Appl. No. 11/975,473, filed Oct. 18, 2007, entitled "Use of VHF RF plasma to deposit high tensile stress films with improved film properties for use in strained silicon technology."

U.S. Appl. No. 11/899,683, filed Sep. 7, 2007, entitled "Tensile dielectric films using UV curing."

U.S. Appl. No. 12/116,889, filed May 7, 2008, entitled "Method for Making High Stress Boron Carbide Films."

US Office Action, dated Oct. 28, 2008, issued in U.S. Appl. No. 11/975,473.

US Office Action, dated Mar. 23, 2009, issued in U.S. Appl. No. 11/975,473.

US Office Action, dated Oct. 9, 2009, issued in U.S. Appl. No. 11/975,473.

US Office Action, dated Mar. 25, 2010, issued in U.S. Appl. No. 11/975,473.

US Office Action, dated Nov. 1, 2010, issued in U.S. Appl. No. 11/975,473.

US Office Action, dated May 29, 2009, issued in U.S. Appl. No. 11/899,683.

US Office Action, dated Feb. 8, 2010, issued in U.S. Appl. No. 11/899,683.

US Office Action, dated Apr. 5, 2010, issued in U.S. Appl. No. 12/116,889.

US Office Action, dated Jan. 18, 2011, issued in U.S. Appl. No. 12/116,889.

US Office Action, dated Jun. 23, 2011, issued in U.S. Appl. No. 12/116,889.

US Office Action, dated Sep. 22, 2010, issued in U.S. Appl. No. 12/134,961.

US Office Action, dated Mar. 10, 2011, issued in U.S. Appl. No. 12/134,961.

US Notice of Allowance, dated Jun. 13, 2011, issued in U.S. Appl. No. 12/134,961.

US Office Action, dated Feb. 9, 2010, issued in U.S. Appl. No. 12/134,969.

US Office Action, dated Jun. 10, 2010, issued in U.S. Appl. No. 12/134,969.

US Notice of Allowance, dated Nov. 18, 2010, issued in U.S. Appl. No. 12/134,969.

WO International Search Report and Written Opinion dated Oct. 11, 2011, issued in Application No. PCT/US2011/029662.

Tan, Kian-Ming et al. (2007) "A New Liner Stressor with Very High Intrinsic Stress (>6GPa) and Low Permittivity Comprising Diamond-Like Carbon (DLC) for Strained P-Channel Transistors", *IEEE*, pp. 127-130.

Arghavani, R. et al. (2006) "Strain Engineering in Non-Volatile Memories", Semiconductor International.

Varadarajan et al. (2005) "Development of high stress SiN films for use with strained silicon technologies", Proc. $68^{th}$ Symp. On Semiconductors and IC Tech., Kyoto.

P. Morin et al. (2005) "Tensile contact etch stop layer for nMOS performance enhancement: influence of the film morphology", ECS meeting.

Takagi et al. (1998) "High Rate Deposition of a-Si:H and a-$SiN_x$:H by VHF PECVD", Vacuum, 51.

Smith, D.L et al. (1990) "Mechanism of $SiN_3$-$SiH_4$ Plasma", J. Electrochem. Soc., vol. 137 (2).

Nagayoshi et al. (1992) "Residual Stress of a $Si_{1-x}N_x$: H Films Prepared by Afterglow Plasma Chemical Vapor Deposition Technique", Jpn. J. Appl. Phys. vol. 31 (1992) pp. L867-L869 Part 2, No. 7A.

Raveh, A. et al. (1992) "Deposition and properties of diamondlike carbon films produced in microwave and radio-frequency plasma", J. Vac. Sci, Technol. A: Vacuum, Surfaces, and Films, pp. 1723-1727.

Takagi et al. (1997) "High Rate Deposition of a-$SiN_x$:H by VHF PECVD", Mat. Res. Soc. Symp. Proc. vol. 467, Materials Research Society.

Piazza, F. and Grambole, D. and Schneider, D. and Casiraghi, C., and Ferrari, A.C. and Robertson, J. (2005) "Protective diamond-like carbon coatings for future optical storage disks", Diamond and Related Materials, 14 (3-7). pp. 994-999.

B. Kleinsorge, A. Ilie, M. Chinowalla, W. Fukarek, W.I. Milne, J. Robertson (1998) "Electrical and optical properties of boronated tetrahedrally bonded amorphous carbon (ta-C:B)", Diamond and Related Materials, 7 (1998) pp. 472-476.

Tan, Kian-Ming et al. (2008) "A High-Stress Liner Comprising Diamond-Like Carbon (DLC) for Strained p-Channel Mosfet", IEEE Electron Device Letters, vol. 29, No. 2.

Xu, Shi et al. (1996) "Properties of carbon ion deposited tetrahedral amorphous carbon films as a function of ion energy", J. Appl. Phys. 79 (9) American Institute of Physics.

Reinke, P. et al. (Nov. 15, 2000) "Hydrogen-plasma etching of ion beam deposited *c*-BN films: An in situ investigation of the surface with electron spectroscopy," Journal of Applied Physics, vol. 88, No. 10, pp. 5597-5604.

Pascual, E. et al. (1999) "Boron carbide thin films deposited by tuned-substrate RF magnetron sputtering", Diamond and Related Materials 8, pp. 402-405.

APPARATUS INCLUDING A PLASMA CHAMBER AND CONTROLLER INCLUDING INSTRUCTIONS FOR FORMING A BORON NITRIDE LAYER

CROSS-REFERENCE TO RELATED APPLICATIONS

This application is a divisional of U.S. patent application Ser. No. 12/750,180, filed Mar. 30, 2010, titled DEPOSITING CONFORMAL BORON NITRIDE FILM BY CVD WITHOUT PLASMA, now pending; the disclosure of which is incorporated herein by reference in its entirety and for all purposes.

FIELD OF THE INVENTION

This invention relates to electronic devices and associated fabrication processes. More specifically, the invention relates to depositing conformal boron nitride films that can be usefully applied as front end spacers or etch stop or barrier layers in semiconductor device fabrication.

BACKGROUND OF THE INVENTION

Semiconductor processing involves forming Metal Oxide Semiconductor (MOS) transistors on wafers. A MOS transistor typically includes a gate dielectric and a gate electrode, a source and a drain, and a channel region between the source and the drain. In Complimentary Metal Oxide Semiconductor (CMOS) technology, transistors may typically be of two types: Negative Channel Metal Oxide Semiconductor (NMOS) and Positive Channel Metal Oxide Semiconductor (PMOS) transistors. The transistors and other devices may be interconnected to form integrated circuits (ICs) which perform numerous useful functions.

Dielectric materials have important roles in semiconductor processing. In the front end formation of MOS transistors on wafers, dielectrics are used to isolate gate electrodes, among other uses. In this regard, spacer dielectric is applied to the side surfaces of gate electrodes. Such front end gate spacers tend to be composed of silicon dioxide or silicon nitride. However, there materials can have a high dielectric constant (k), can be nontrivial to remove if desired, and, if deposited by PECVD, the conformality of these materials is also subject to a pattern loading effect. Moderate k dielectric also finds use in back end processing, for example as etch stop, hard mask or dielectric barrier layers.

SUMMARY OF THE INVENTION

The present invention pertains to a boron nitride or boron carbon nitride dielectric layer formed by chemical vapor deposition (CVD) of a boron-containing film on a substrate, at least a portion of the deposition being conducted without plasma, and then exposing the deposited boron-containing film to a plasma. The CVD component dominates the deposition process, producing a conformal film without loading effect. The dielectric is ashable, and can be removed with a hydrogen plasma without impacting surrounding materials. The dielectric has a much lower wet etch rate compared to other front end spacer or hard mask materials such as silicon oxide or silicon nitride, and has a relatively low dielectric constant, much lower then silicon nitride, for example.

In one aspect, the invention relates to a method of forming a dielectric layer. The method involves receiving in a plasma processing chamber a substrate, and forming a boron nitride or boron carbon nitride film on the substrate. The film is formed by a process including chemical vapor deposition of a boron-containing film on the substrate, at least a portion of the deposition being conducted without plasma; and exposing the deposited boron-containing film to a plasma.

In another aspect, the invention relates to a semiconductor processing apparatus having a plasma processing chamber and a controller having program instructions for forming a dielectric layer according to the inventive method.

These and other aspects and advantages of the invention are described further below and with reference to the drawings.

DETAILED DESCRIPTION OF SPECIFIC EMBODIMENTS

Reference will now be made in details to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order to not unnecessarily obscure the present invention.

Introduction

The present invention relates to a boron nitride or boron carbon nitride dielectric layer formed by chemical vapor deposition (CVD) of a boron-containing film on a substrate, at least a portion of the deposition being conducted without plasma, and then exposing the deposited boron-containing film to a plasma. The CVD component dominates the deposition process, producing a conformal film without loading effect. The dielectric is ashable, and can be removed with a hydrogen plasma without impacting surrounding materials. The dielectric has a much lower wet etch rate compared to other front end spacer or hard mask materials such as silicon oxide or silicon nitride, and has a relatively low dielectric constant, much lower then silicon nitride.

Process

Figure 1:
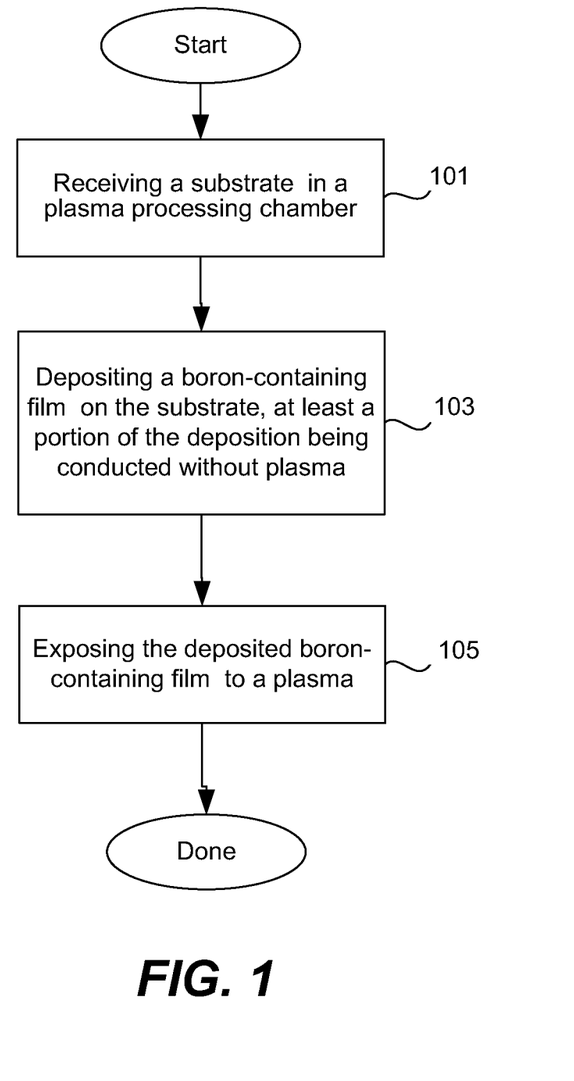
FIG. 1 depicts important stages in a process flow for a method of fabricating a strained transistor structure in accordance with an embodiment of the present invention.

Dielectric formation in accordance with the present invention can be conducted according to a variety of different protocols involving deposition of a boron-containing film without plasma, followed by exposure of the deposited boron-containing film to a plasma. FIG. 1 is a process flow chart illustrating this general aspect of the present invention for formation of a boron nitride or boron carbon nitride dielectric layer. A substrate is received in a plasma processing chamber, generally in a plasma enhanced chemical vapor deposition (PECVD) reactor (101). A boron-containing film is deposited on the substrate, at least a portion of the deposition being conducted without plasma (103). Then, the deposited boron-containing film is exposed to a plasma (105). This plasma treatment densifies the film by removing hydrogen. If the as-deposited film is not boron nitride or boron carbon nitride, the plasma treatment can be conducted with a gas mixture composed to have the effect of converting a deposited boron-containing film to a boron nitride or a boron carbide nitride film. The plasma may be off during all or just part the deposition operation, and/or may be on only when there is no boron-containing reactant in the processing chamber. The depositing and plasma treating operations may be repeated one or more times.

The thickness of the deposited film and the duration of the plasma treatment are such that following the plasma treatment, the resulting film has been completely penetrated by the plasma for densification, and to the extent that the as-deposited film is not boron nitride or boron carbon nitride, it is converted to boron nitride or boron carbon nitride. In specific embodiments, a suitable thickness for the deposited film is no more than 10 Å thick, for example about 5 Å thick. By repeating the film deposition and plasma treatment operations, the final dielectric layer thickness can be tailored as appropriate for specific applications. Thickness in the range of about 10 to 1000 Å may be achieved, for example. In some specific embodiments, such as for front end gate spacers, a dielectric layer thickness of about 50 to 500 Å, for example about 200 to 400 A, such as about 300 Å may be used. In such embodiments, the dielectric layer may, then, be composed of about 5 to 100, or for example 40-60, deposited and plasma treated film layers.

The source of the boron-containing film for the deposition operation can be a boron hydride such as diborane ($B_2H_6$) or an organo-borane such as trimethylboron, or, for boron nitride deposition, a boron, hydrogen and nitrogen-containing species such as borazine, or another boron precursor that will readily decompose to metallic boron or boron carbide when exposed to a substrate of the appropriate temperature. In general, and for specifically noted precursors, a temperature range of 200 to 400° C. would be adequate for such decomposition to occur. In the case of an organo-borane precursor, the carbon in the precursor molecule may be retained in the deposited boron film.

If a direct CVD boron nitride or boron carbon nitride film is desired, a gas phase nitrogen source, such as ammonia ($NH_3$) or nitrogen ($N_2$) can be added to the reactor in addition to the boron containing precursor. Or, a single precursor species with a molecular amino-borane character, such as borazine (generically $B_xH_yN_z$, a boron, hydrogen and nitrogen-containing species) may also be used.

Suitable deposition process and parameters in accordance with the present invention include deposition of a boron-containing film with a boron hydride or organo-borane precursor and subsequent conversion to a corresponding boron nitride or boron carbon nitride by exposure to a nitrogen-containing species during post-deposition plasma treatment of the deposited film; direct deposition of boron nitride or boron carbon nitride with a boron hydride or organo-borane precursor and a nitrogen-containing species; direct deposition of boron nitride with a single precursor species with a molecular amino-borane character, such as borazine; direct deposition of boron carbon nitride with a boron hydride, amino-borane or organo-borane precursor with a nitrogen-containing species, a hydrocarbon and/or another carbon-containing process gas. Relevant deposition parameters for some specific embodiments include a flow rate of about 1-6 L/min. for the boron-containing precursor (e.g., diborane, trimethylboron or borazine precursor); about 1-10 L/min. for the nitrogen-containing process gas (e.g., $NH_3$); HFRF: about 200-1000 W; LFRF: about 200-2000 W; total pressure: about 2-5 T. The duration of the boron-containing precursor deposition (soak) and plasma treatment can significantly impact the film quality. Short deposition times (e.g., 5-10 sec) and longer treatment times (e.g., 10-20 sec) are preferable for leakage and conformality.

Following deposition of the boron-containing film, the film is exposed to a plasma treatment. In general, the plasma is produced by a capacitively coupled plasma source. The source may operate with a single or dual frequency at a power of about 200-1000 W HFRF, and about 200-2000 W LFRF (total power for a four station tool; a single station tool may also be used with scaled power), and a temperature of about 300-500° C., for example about 400° C.

Between the deposition and plasma post-treatment, the process chamber may be purged. The purge removes any boron-containing precursor remaining from the deposition operation so that the plasma treatment can be conducted in the absence of any precursor that would incidentally deposit when the plasma is on and potentially degrade the quality of the deposited film. Various purge techniques may be used, including turning off boron-containing precursor source flow and maintaining or adding an ammonia or inert gas (e.g., $N_2$, He, Ar) flow, either discretely or gradually; pumping down the chamber to remove all process gases; or changing the gap between the pedestal and the showerhead to prevent reaction while the process gases are unchanged. The purge may be conducted for any suitable time, for example about 5-20 sec, to ensure that boron-containing precursor is completely removed from the reaction chamber.

In embodiments where the as-deposited boron-containing film is boron nitride or boron carbon nitride, the plasma treatment may be conducted without any additional process gasses present, or with an inert gas such as He, Ar, Xe or other noble gases. In other embodiments, the plasma treatment of such as-deposited films may be conducted with additional process gasses present in order to modify the composition of the films for the final dielectric produced. In yet other embodiments, such as where the as-deposited boron-containing film is not boron nitride or boron carbon nitride, the plasma treatment may be conducted with additional process gases in order to convert the as-deposited film to boron nitride or boron carbon nitride.

Additional process gases involved in the post-deposition plasma treatment may be one or a combination of: (1) $NH_3$, $N_2$, or some other nitrogen-based molecule that can react with the as-deposited film to form or increase the proportion of nitrogen in boron nitride or boron carbon nitride; (2) He, Ar, Xe, or other noble gases; (3) hydrocarbons such as $CH_4$, $C_2H_6$, $C_2H_4$, $C_2H_2$, etc., to form or increase the proportion of carbon in boron carbon nitride. In some embodiments, it may be desirable to add hydrogen ($H_2$) to the gas mixture as well to add an etching component. The addition of hydrogen in the deposition gas mixture of can actually lead to a film that has less hydrogen because the molecular hydrogen can help remove bound hydrogen from the matrix. In this way, more weakly bonded species are etched before more strongly. So, the addition of an etch component may result in a denser film.

The plasma treatment has the effect of densifying the film by removing hydrogen, for example by removing as much hydrogen as possible from the as-deposited film. Infrared absorption analysis of the B—H bond is a good indicator of the ability to remove hydrogen, as is the electrical measurement of the dielectric breakdown of the material. Such data is presented below in conjunction with the description of specific embodiments or examples of the invention as evidence of the beneficial results obtained by its use.

A pre-treatment or nucleation initiation layer may also be used prior to the boron-containing film deposition. It has been found that an $NH_3$ pre-treatment, for example with an ammonia plasma, can enhance the adhesion of boron nitride to materials such as copper. Another possible pre-treatment agent is $H_2$. An initiation layer, such as a very thin layer of silicon nitride or silane for example, can also be used to enhance nucleation of a low hydrogen boron nitride.

The boron nitride or boron carbon nitride dielectric resulting from a process in accordance with the present invention has the capacity of being at least 80% and up to 100% conformal with no loading effect as the conformality is driven by the CVD deposition process. This process also uses plasma, and is thus capable of running at a higher deposition rate than a traditional ALD process. The dielectric is ashable, and so can be easily removed from the substrate by ashing, for example ashing conducted with a hydrogen plasma.

According to a first aspect of the invention, the boron-containing film deposition operation is conducted entirely without plasma. Within the scope of this aspect are several possible variations noted above, including chemical vapor deposition using a boron hydride or organo-borane precursor, with or without a nitrogen-containing process gas or other process gases. Specific embodiments include: deposition using a boron hydride precursor without a nitrogen-containing process gas, followed by exposure of the deposited film to a nitrogen-containing plasma (such as an ammonia plasma) for film nitridation and densification; deposition using an organo-borane precursor without a nitrogen-containing process gas, followed by exposure of the deposited film to a temperature sufficient to convert the organo-borane to boron-carbide or metallic boron, and a nitrogen-containing plasma for film nitridation and densification; deposition using a boron hydride precursor with a nitrogen-containing process gas such that the as-deposited film is boron nitride, followed by exposure of the deposited film to a plasma for film densification; and, deposition using an organo-borane precursor with a nitrogen-containing process gas such that the as-deposited film is boron carbon nitride, followed by exposure of the deposited film to a plasma for film densification. Other specific variants within the general scope of the invention as described herein, for example using other process gases during the deposition and/or post-deposition plasma treatment operations, are also possible.

Another embodiment according to this aspect of the invention involves pulsing of the plasma during the film deposition process. According to this embodiment, a boron hydride or organo-borane boron-containing film precursor and a nitrogen-containing species are present in the chamber together for at least a portion of the film deposition operation. However, the boron-containing reactant flow into the processing chamber is controlled such that a boron precursor is only present when the plasma is off. According to this embodiment, the signal gating the pulsed radiofrequency plasma source can be used to trigger an ALD valve connected to the boron precursor source line such that the boron precursor is only present in the chamber during the off portion of the radiofrequency cycle. In this way, no boron will be deposited during the "on" or post-treatment portion of the cycle. A suitable pulsing frequency for the plasma in this embodiment is on the order of about 0.1 to 1 Hz for example, about 0.5 Hz, and may be limited by the time required to charge and discharge the boron-containing precursor dispensed by the valve.

Dielectrics formed according to these embodiments, without plasma during boron-containing film deposition, will have high conformality. The as-deposited films will have low density; the density is increased by the post-deposition plasma treatment. These dielectric formation techniques may be advantageously applied, for example, in circumstances where a high level of conformality is a priority.

According to another aspect of the invention, a pulsed radiofrequency source is used to excite plasma in a reaction chamber in which the boron-containing precursor and a nitrogen-containing species are both present during the film deposition operation. The duty cycle and frequency of the radiofrequency source can be set such that the plasma will completely extinguish in the off portion of the cycle. The CVD boron growth occurs in the "on" (plasma present) and "off" (no plasma present) portions of the cycle, while nitridation occurs only in the "on" portion of the cycle. Because the precursor is present in both the "on" and "off" portions of the pulsed plasma cycle, and a boron containing film will be deposited in both, the resulting film may have less than 100% conformality and the inclusion of some level of density loading. A suitable pulsing frequency for the plasma in this embodiment is on the order of about 1 Hz to 10 kHz, for example about 500 Hz, and is not limited by the time required to charge and discharge the boron-containing precursor dispensed by a valve into the processing chamber, but by the level of conformality required in the dielectric layer formed. Film deposition using such a pulsing technique is described, for example, in application Ser. No. 12/253,807, filed Oct. 17, 2008, entitled Method for Improving Process Control and Film Conformality of PECVD Film, incorporated herein by reference for this purpose. The more the plasma is on during boron-containing film deposition, the less conformal but more dense the deposited film, so that less post-deposition plasma treatment is required to reach a desired density level. This film formation technique may be advantageously applied, for example, in circumstances where less than optimal conformality is acceptable and process efficiency and high film density is a priority.

A dielectric formed in accordance with the present invention film can be used as a front end of line gate spacer or back end of line hard mask, for example. This material can be removed by ashing with a hydrogen plasma and, depending upon the amount of hydrogen or carbon in the dielectric, can have a very low wet etch rate. It is thus ashable in the same sense as amorphous carbon; however, boron nitride is also a stable dielectric which can be designed to have a low dielectric constant, low leakage, and high breakdown voltage. This material can thus be either sacrificial or permanent. If sacrificial, a simple hydrogen plasma can be used to remove the boron nitride without affecting the other materials.

MOS Device Context

Figure 2:
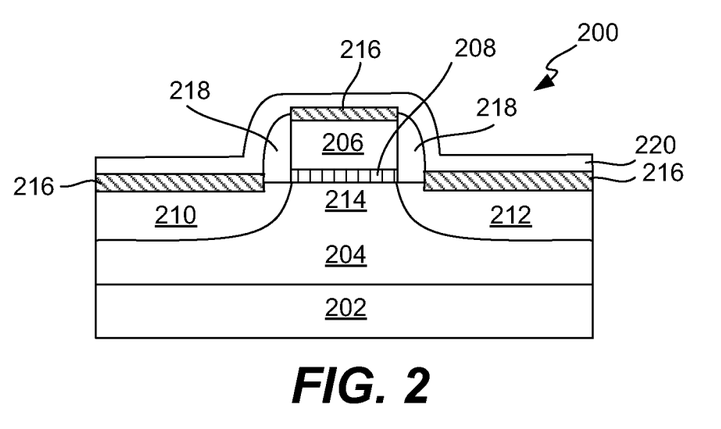
FIG. 2 illustrates a simple MOS transistor architecture to show a device context in accordance with which embodiments of the present invention may be implemented.

FIG. 2 illustrates a simple MOS transistor, in this case a PMOS transistor, architecture to show a device context in accordance with which embodiments of the present invention may be implemented. As noted above, one suitable use for a dielectric formed in accordance with the present invention is as front end spacer dielectric in a MOS transistor. Referring to FIG. 2, a PMOS transistor 200 is typically composed of a p-doped substrate 202 and an n-doped well 204 within the substrate 202, which are typically a part of an overall wafer substrate together with other transistors and devices. The p-doped substrate 202 may include any suitable p-type dopants, such as boron and indium, and may be formed by any suitable technique. The n-doped well 204 may include any suitable n-type dopants, such as phosphorus and arsenic, and may be formed by any suitable technique. For example, the n-doped well 204 may be formed by doping the substrate 202 by ion implantation.

The transistor further includes a conductive gate electrode 206 that is separated from the n-doped well 204 by a gate dielectric 208. The gate electrode 206 may include any suitable material, such as doped or undoped polysilicon. Typically, the gate dielectric 208 is deposited in the form of silicon dioxide, but other, for example high-k, gate dielectric materials can be also selected.

The PMOS transistor 200 also includes p-doped source 210 and drain 212 regions in the n-doped well 204. The source 210 and drain 212 regions are located on each side of the gate 206 forming a channel 214 within the well 204. The source 210 and drain 212 regions may include a p-type dopant, such as boron. Additionally, the source 210 and drain 212 regions may be formed in recesses of the n-doped well 204.

The transistor may also include sidewall spacers 218 formed in accordance with the present invention along the sidewalls of the gate 206. The spacers 218 may be composed of boron nitride or boron carbon nitride. The source 210 and drain 212 regions and the gate 206 may covered with a layer of self-aligned silicide (salicide) 216. A capping layer 120, for example composed of a compressive boron carbide covers as a blanket film the entire surface of the PMOS transistor 200.

The general manufacturing steps for fabricating PMOS transistors are well-known in the art. Such processes may be readily adapted to form sidewall spacer dielectric in accordance with the present invention given the direction provided herein.

Apparatus

The present invention is preferably implemented in a capacitively coupled plasma enhanced chemical vapor deposition (PECVD) reactor. Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing boron nitride or boron carbon nitride deposition and treatment in accordance with the present invention is transferred from one station to another within the reactor during the process. While in process, each wafer is held in place by a pedestal, wafer chuck and/or other wafer holding apparatus. For certain operations in which the wafer is to be heated, the apparatus may include a heater such as a heating plate. In a preferred embodiment of the invention, a Vector™ or Sequel™ reactor, produced by Novellus Systems of San Jose, Calif., may be used to implement the invention.

Figure 3:
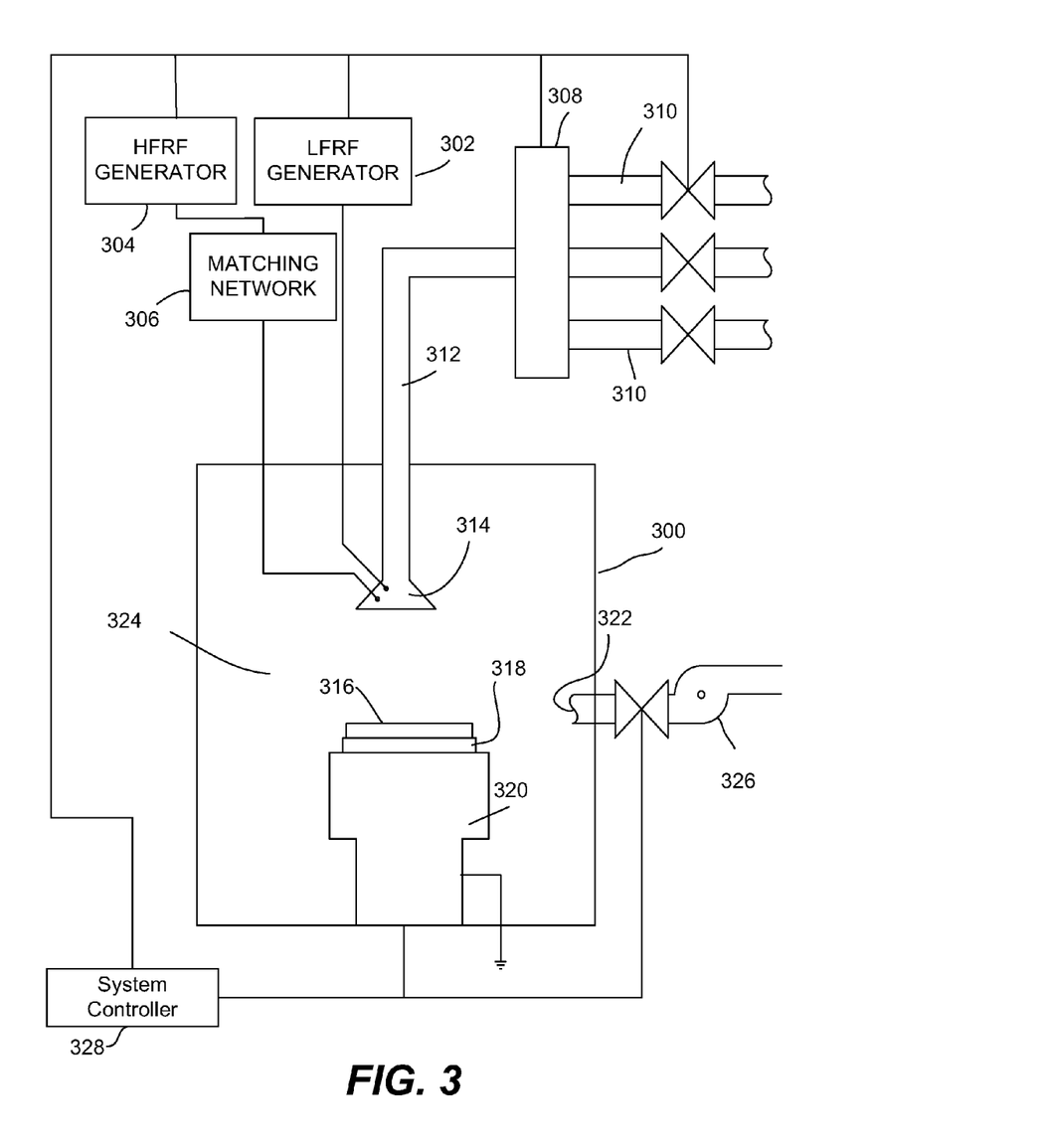
FIG. 3 provides a simple block diagram depicting various reactor components arranged for implementing the present invention.

FIG. 3 provides a simple block diagram depicting various reactor components arranged for implementing the present invention. As shown, a reactor 300 includes a process chamber 324, which encloses other components of the reactor and serves to contain the plasma generated by a capacitor type system including a showerhead 314 working in conjunction with a grounded heater block 320. A high-frequency (HF) RF generator 302, connected to a matching network 306, and a low-frequency (LF) RF generator 304 are connected to showerhead 314. In an alternative embodiment, the LF generator 304 can be connected to or located below a wafer pedestal 318. The power and frequency supplied by matching network 306 is sufficient to generate a plasma from the process gas/vapor. In the implementation of the present invention both the HF generator and the LF generator are used. In a typical process, the HF generator is operated generally at frequencies between 2-60 MHz; in a preferred embodiment at 13.56 MHz. The LF generator is operated generally between 100-800 kHz; in a preferred embodiment at 300-500 kHz.

The description of the apparatus and respective process parameters listed here are valid for a Novellus Sequel™ module having six stations to deposit boron nitride or boron carbon nitride on a 200 mm wafer. One skilled in the art will readily appreciate that the process parameters may be scaled based on the chamber volume, wafer size, and other factors. For example, power outputs of LF and HF generators are typically directly proportional to the deposition surface area of the wafer. The power used on 300 mm wafer will generally be 2.25 higher than the power used for 200 mm wafer. Similarly, the flow rates, such as standard vapor pressure, will depend on the free volume of the vacuum chamber.

Within the reactor, a wafer pedestal 318 supports a substrate 316 on which a highly compressive dielectric capping layer in accordance with the invention is to be deposited. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research. The wafer pedestal 318 is functionally coupled with a grounded heater block 320 for heating substrate 316 to a desired temperature. Generally, substrate 316 is maintained at a temperature in a range of about from 25° C. to 500° C., preferably in a range of about from 200° C. to 400° C. to avoid thermal degradation of circuit components, such as a salicide layer, and/or for other process related purposes, as noted above.

Process gases/vapors are introduced via inlet 312. Multiple source gas lines 310 are connected to manifold 308. The gases/vapors may be premixed or not in the manifold. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 300 via an outlet 322. A vacuum pump 326 (e.g., a one or two stage mechanical dry pump and/or a turbomolecular pump) typically draws process gases out and maintains a suitably low pressure within the reactor by a close loop controlled flow restriction device, such as a throttle valve or a pendulum valve. In a method in accordance with the invention, pressures in the reaction chamber generally are maintained in a range of about from 0.1 Torr to 30 Torr, preferably in a range of about from 0.5 Torr to 10 Torr.

In certain embodiments, a system controller 328 is employed to control process conditions during the boron nitride or boron carbon nitride dielectric layer formation in accordance with the present invention, and other process operations. The controller will typically include one or more memory devices and one or more processors. The processor may include a CPU or computer, analog and/or digital input/output connections, stepper motor controller boards, etc.

In certain embodiments, the controller controls all of the activities of the reactor. The system controller executes system control software including sets of instructions for controlling the timing of the processing operations, frequency and power of operations of the LF generator 302 and the HF generator 304, flow rates and temperatures of precursors and inert gases and their relative mixing, temperature of the heater block 320, pressure of the chamber, and other parameters of a particular process. Other computer programs stored on memory devices associated with the controller may be employed in some embodiments.

Typically there will be a user interface associated with controller 328. The user interface may include a display screen, graphical software displays of the apparatus and/or process conditions, and user input devices such as pointing devices, keyboards, touch screens, microphones, etc.

The computer program code for controlling the processing operations can be written in any conventional computer readable programming language: for example, assembly language, C, C++, Pascal, Fortran or others. Compiled object code or script is executed by the processor to perform the tasks identified in the program.

The controller parameters relate to process conditions such as, for example, timing of the processing steps, flow rates and temperatures of precursors and inert gases, temperature of the wafer, pressure of the chamber and other parameters of a particular process. These parameters are provided to the user in the form of a recipe, and may be entered utilizing the user interface.

Signals for monitoring the process may be provided by analog and/or digital input connections of the system controller. The signals for controlling the process are output on the analog and digital output connections of the reactor.

The system software may be designed or configured in many different ways. For example, various chamber component subroutines or control objects may be written to control operation of the chamber components necessary to carry out the inventive deposition processes. Examples of programs or sections of programs for this purpose include substrate timing of the processing steps code, flow rates and temperatures of precursors and inert gases code, and a code for pressure of the chamber.

The invention may be implemented on a multi-station or single station tool. In specific embodiments, the 300 mm Novellus Vector™ tool having a 4-station deposition scheme or the 200 mm Sequel™ tool having a 6-station deposition scheme are used. It is possible to index the wafers after every deposition and/or post-deposition plasma anneal treatment until all the required depositions and treatments are completed, or multiple depositions and treatments can be conducted at a single station before indexing the wafer.

EXAMPLES

The following examples are provided to further illustrate aspects and advantages of the present invention. These examples are provided to exemplify and more clearly illustrate aspects of the present invention and are in no way intended to be limiting.

Several dielectric layers were formed by boron nitride film deposition and treatment in accordance with the present invention. Process parameters and details are noted in Table 1, below:

TABLE 1

| | | B2H6 Soak Conditions | | | | | | Post Treat Conditions | | | | |
|---|---|---|---|---|---|---|---|---|---|---|---|---|
| | Pre | | | | | SD | | | | | | |
| Film | treat | B2H6 | NH3 | H2 | He | Time | Purge | NH3 | N2 | HFRF | LFRF | Time |
| Film 1 | — | 4125 | 7000 | 0 | 0 | 15 | — | 7000 | 0 | 0 | 0 | 5 |
| Film 2 | — | 4125 | 7000 | 0 | 0 | 15 | With NH3 | 7000 | 0 | 750 | 450 | 5 |
| Film 3 | — | 4125 | 7000 | 0 | 0 | 5 | With NH3 | 7000 | 0 | 750 | 450 | 10 |
| Film 4 | UV SiN 1 sec | 4125 | 7000 | 0 | 0 | 5 | With NH3 | 7000 | 0 | 750 | 450 | 10 |
| Film 5 | — | 4125 | 7000 | 0 | 0 | 5 | With NH3 | 7000 | 0 | 750 | 450 | 20 |
| Film 6 | — | 4125 | 7000 | 0 | 0 | 5 | With NH3 | 700 | 15000 | 750 | 450 | 10 |

Film 1 was made by CVD boron nitride without post-deposition plasma treatment for purposes of comparison with Films 2-6 formed in accordance with the present invention. The remaining films were conformal boron nitride deposited by CVD without plasma according to the parameters noted in the table above, followed by an ammonia plasma post treatment. The deposition of Film 4 was preceded by deposition of a SiN initiation layer. In each case, the deposition and the process chamber was purged between the film deposition and treatment operations.

Figure 4:
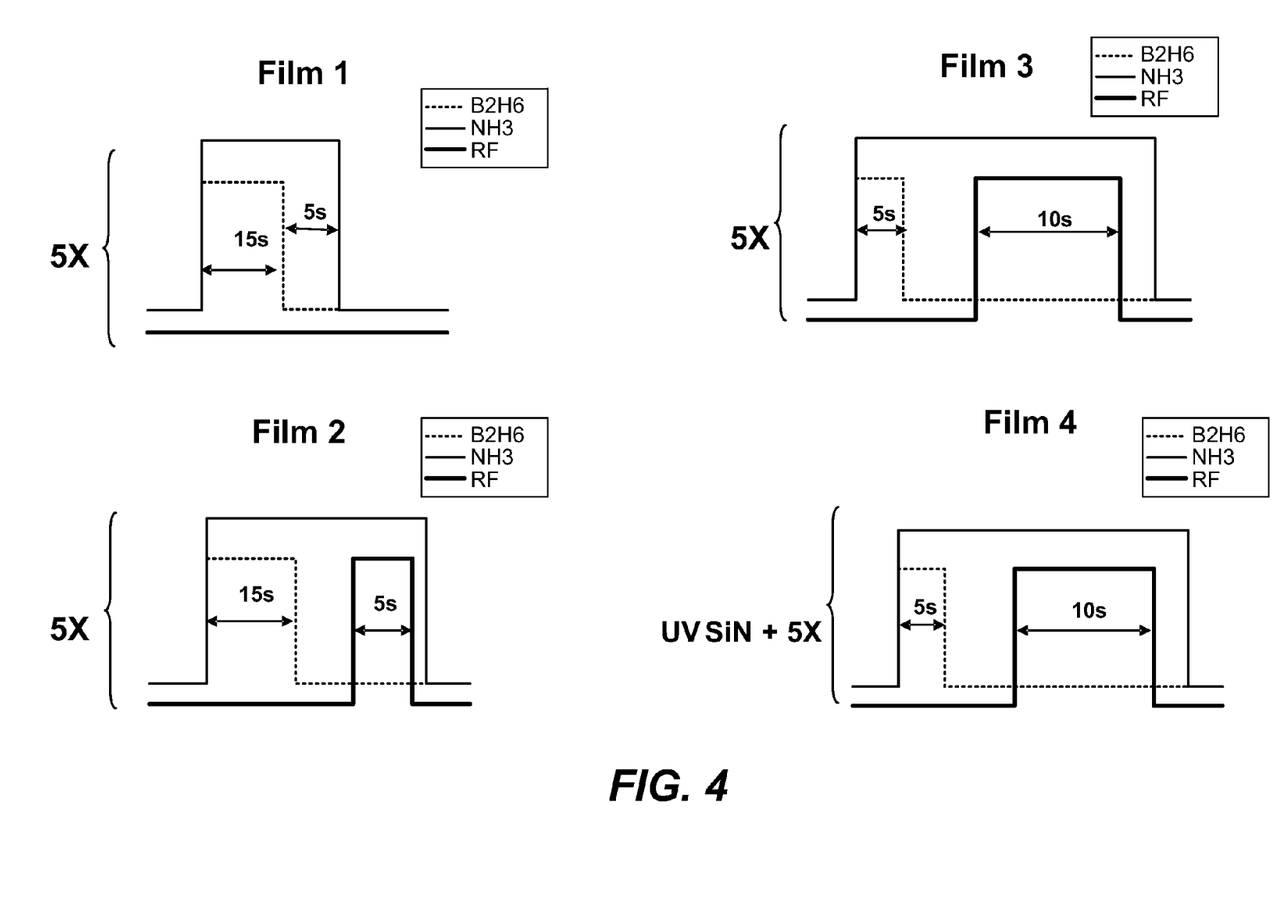
FIG. 4 illustrates the process sequences for made as examples of the present invention.

The process sequences for Films 1-4 are illustrated in FIG. 4. As noted in the description above, there are many other possible process parameters variations within the scope of the invention including the flowing of additional process and/or inert gases during the deposition and/or treatment operations, or the absence of a nitrogen containing gas during the deposition operation.

Electrical measurements of six boron nitride dielectric materials are noted in the Table 2 below:

TABLE 2

| Film | k | @ 1 MV/cm A/cm2 | @ 2 MV/cm A/cm2 | @ 4 MV/cm A/cm2 | BDV MV/cm |
|---|---|---|---|---|---|
| Film 1 | 4.62 | 1.88E−07 | 1.75E−05 | 0.0247 | −2.97 |
| Film 2 | 4.560 | 1.53E−07 | 6.03E−05 | 0.0784 | −2.63 |
| Film 3 | 4.360 | 4.81E−09 | 2.29E−07 | 0.0004 | −4.33 |

TABLE 2-continued

| Film | k | @ 1 MV/cm A/cm2 | @ 2 MV/cm A/cm2 | @ 4 MV/cm A/cm2 | BDV MV/cm |
|---|---|---|---|---|---|
| Film 4 | 4.470 | 1.20E−09 | 3.17E−08 | 3.14651E−05 | −5.31 |
| Film 5 | 4.708 | 9.81E−10 | 9.36E−09 | 1.30E−05 | −5.33 |
| Film 6 | 4.699 | 1.30E−09 | 3.13E−09 | 3.40E−06 | −5.78 |

The measurements indicate low dielectric constant and reasonable electrical breakdown and leakage. The decrease in leakage as a function of increased plasma exposure indicates that the metallic character of the boron is being converted to a boron nitride dielectric. The effect of changing the duration or conditions of the plasma post treatment on the bulk film properties of the resulting dielectric can be seen with reference to Films 5 and 6.

Figure 5:
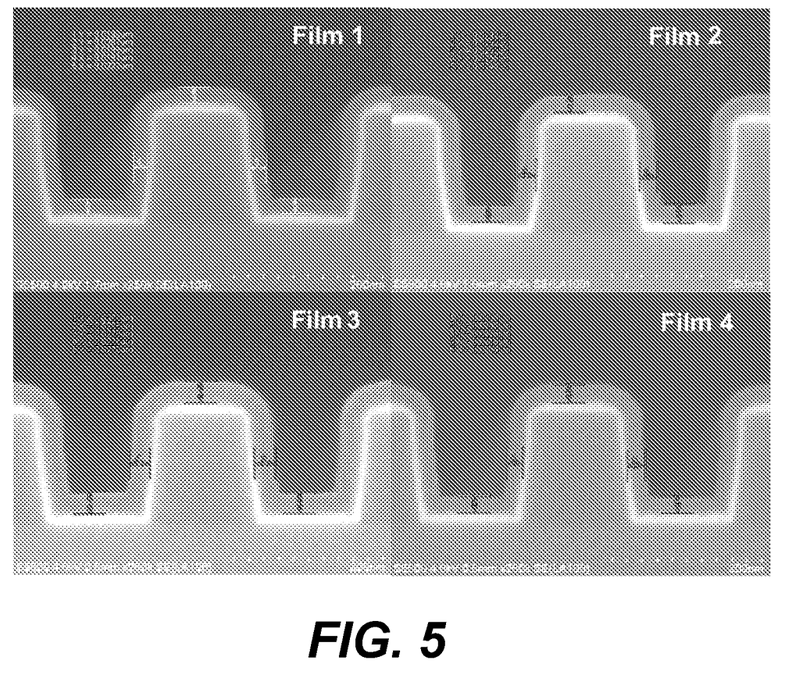
FIG. 5 depicts cross-sections of boron nitride dielectric film materials made in accordance with the present invention illustrating the extreme conformality of the films produced by CVD deposition.

FIG. 5 depicts cross-sections of the first four boron nitride dielectric film materials illustrating the extreme conformality of the films produced by all processes. This validates the notion that conformal deposition is truly driven by the CVD deposition component and is not modified geometrically by the plasma treatment.

Figure 6:
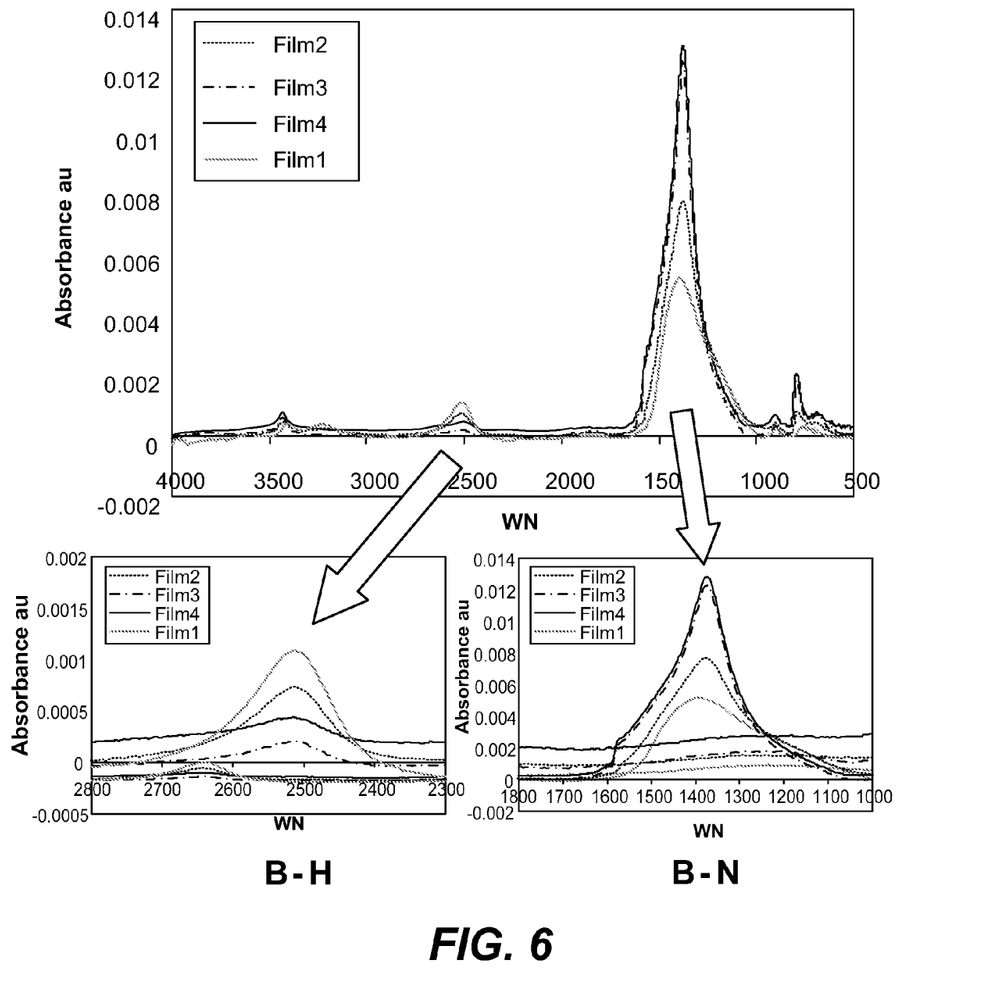
FIG. 6 depicts plots of an infrared absorption study of dielectric materials made in accordance with the present invention.

FIG. 6 depicts plots of an infrared absorption study of these materials showing that the films are indeed a boron nitride character and that the amount of hydrogen in the film can be decreased by a modification of the process parameters.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein.

What is claimed is:

1. A semiconductor processing apparatus, comprising:
a plasma processing chamber; and
a controller configured to execute program instructions for:
    receiving in the plasma processing chamber a substrate;
    forming a boron nitride or boron carbon nitride film by a process comprising,
        chemical vapor deposition of a boron-containing film on the substrate, at least a portion of the deposition being conducted without plasma, and,
        exposing the deposited boron-containing film to a plasma.

* * * * *